United States Patent [19]
Arimilli et al.

[11] Patent Number: 6,023,746
[45] Date of Patent: Feb. 8, 2000

[54] DUAL ASSOCIATIVE-CACHE DIRECTORIES ALLOWING SIMULTANEOUS READ OPERATION USING TWO BUSES WITH MULTIPLEXORS, ADDRESS TAGS, MEMORY BLOCK CONTROL SIGNALS, SINGLE CLOCK CYCLE OPERATION AND ERROR CORRECTION

[75] Inventors: Ravi Kumar Arimilli, Austin; John Steven Dodson, Pflugerville; Jerry Don Lewis, Round Rock; Timothy M. Skergan, Austin, all of Tex.

[73] Assignee: International Business Machines Corporation, Armonk, N.Y.

[21] Appl. No.: 08/839,558

[22] Filed: Apr. 14, 1997

[51] Int. Cl.[7] ........................................................ G06F 12/00
[52] U.S. Cl. ............................. 711/118; 711/124; 711/119; 711/113
[58] Field of Search ............................. 395/308; 711/127, 711/207, 118, 119, 113, 120, 124

[56] References Cited

U.S. PATENT DOCUMENTS

| | | |
|---|---|---|
| 5,058,116 | 10/1991 | Chao et al. ............................. 371/40.2 |
| 5,099,485 | 3/1992 | Bruckert et al. ........................ 371/68.3 |
| 5,249,187 | 9/1993 | Bruckert et al. ........................ 371/68.1 |
| 5,319,766 | 6/1994 | Thaller et al. ........................... 395/425 |
| 5,325,520 | 6/1994 | Nguyen et al. .......................... 395/575 |
| 5,502,728 | 3/1996 | Smith, III ........................... 395/182.03 |

*Primary Examiner*—John W. Cabeca
*Assistant Examiner*—David Laugjahr
*Attorney, Agent, or Firm*—Richard A. Henkler; Jack V. Musgrove; Andrew J. Dillon

[57] ABSTRACT

A method of accessing values stored in a cache used by a processor of a computer system, whereby two read operations may occur simultaneously is disclosed. Memory blocks from a memory device are loaded into respective cache lines of the cache, and address tags associated with the memory blocks are written into two redundant cache directories of the cache. Thereafter, a first memory block can be read from the cache using the first cache directory, while a second memory block is simultaneously read from the cache using the second cache directory. The cache can have a single cache entry array, or two (redundant) cache entry arrays connected respectively to the two cache directories. If an error occurs when examining a particular address tag in one cache directory, then a redundant address tag can be substituted for the particular address tag by examining a corresponding line of the other cache directory.

14 Claims, 4 Drawing Sheets

DUAL ASSOCIATIVE-CACHE DIRECTORIES ALLOWING SIMULTANEOUS READ OPERATION USING TWO BUSES WITH MULTIPLEXORS, ADDRESS TAGS, MEMORY BLOCK CONTROL SIGNALS, SINGLE CLOCK CYCLE OPERATION AND ERROR CORRECTION

BACKGROUND OF THE INVENTION

1. Field of the Invention

The present invention generally relates to computer systems and, more particularly, to a method of improving the performance of a cache used by a processor of a computer system.

2. Description of the Related Art

The basic structure of a conventional computer system 10 is shown in FIG. 1. Computer system 10 may have one or more processing units, two of which 12a and 12b are depicted, which are connected to various peripheral devices, including input/output (I/O) devices 14 (such as a display monitor, keyboard, and permanent storage device), memory device 16 (such as random access memory or RAM) that is used by the processing units to carry out program instructions, and firmware 18 whose primary purpose is to seek out and load an operating system from one of the peripherals (usually the permanent memory device) whenever the computer is first turned on. Processing units 12a and 12b communicate with the peripheral devices by various means, including a generalized interconnect or bus 20. Computer system 10 may have many additional components which are not shown, such as serial and parallel ports for connection to, e.g., modems or printers. Those skilled in the art will further appreciate that there are other components that might be used in conjunction with those shown in the block diagram of FIG. 1; for example, a display adapter might be used to control a video display monitor, a memory controller can be used to access memory 16, etc. Also, instead of connecting I/O devices 14 directly to bus 20, they may be connected to a secondary (I/O) bus which is further connected to an I/O bridge to bus 20. The computer can have more than two processing units.

In a symmetric multi-processor (SMP) computer, all of the processing units are generally identical, that is, they all use a common set or subset of instructions and protocols to operate, and generally have the same architecture. A typical architecture is shown in FIG. 1. A processing unit includes a processor core 22 having a plurality of registers and execution units, which carry out program instructions in order to operate the computer. An exemplary processing unit includes the PowerPC™ processor marketed by International Business Machines Corp. The processing unit can also have one or more caches, such as an instruction cache 24 and a data cache 26, which are implemented using high speed memory devices. Caches are commonly used to temporarily store values that might be repeatedly accessed by a processor, in order to speed up processing by avoiding the longer step of loading the values from memory 16. These caches are referred to as "on-board" when they are integrally packaged with the processor core on a single integrated chip 28. Each cache is associated with a cache controller (not shown) that manages the transfer of data between the processor core and the cache memory.

A processing unit 12 can include additional caches, such as cache 30, which is referred to as a level 2 (L2) cache since it supports the on-board (level 1) caches 24 and 26. In other words, cache 30 acts as an intermediary between memory 16 and the on-board caches, and can store a much larger amount of information (instructions and data) than the on-board caches can, but at a longer access penalty. For example, cache 30 may be a chip having a storage capacity of 256 or 512 kilobytes, while the processor may be an IBM PowerPC™ 604-series processor having on-board caches with 64 kilobytes of total storage. Cache 30 is connected to bus 20, and all loading of information from memory 16 into processor core 22 usually comes through cache 30. Although FIG. 1 depicts only a two-level cache hierarchy, multi-level cache hierarchies can be provided where there are many levels of interconnected caches.

A cache has many "blocks" which individually store the various instructions and data values. The blocks in any cache are divided into groups of blocks called "sets" or "congruence classes." A set is the collection of cache blocks that a given memory block can reside in. For any given memory block, there is a unique set in the cache that the block can be mapped into, according to preset mapping functions. The number of blocks in a set is referred to as the associativity of the cache, e.g. 2-way set associative means that for any given memory block there are two blocks in the cache that the memory block can be mapped into; however, several different blocks in main memory can be mapped to any given set. A 1-way set associate cache is direct mapped, that is, there is only one cache block that can contain a particular memory block. A cache is said to be fully associative if a memory block can occupy any cache block, i.e., there is one congruence class, and the address tag is the full address of the memory block.

An exemplary cache line (block) includes an address tag field, a state bit field, an inclusivity bit field, and a value field for storing the actual instruction or data. The state bit field and inclusivity bit fields are used to maintain cache coherency in a multiprocessor computer system (indicate the validity of the value stored in the cache). The address tag is a subset of the full address of the corresponding memory block. A compare match of an incoming address with one of the tags within the address tag field indicates a cache "hit." The collection of all of the address tags in a cache (and sometimes the state bit and inclusivity bit fields) is referred to as a directory, and the collection of all of the value fields is the cache entry array.

When all of the blocks in a congruence class for a given cache are full and that cache receives a request, whether a "read" or "write," to a memory location that maps into the full congruence class, the cache must "evict" one of the blocks currently in the class. The cache chooses a block by one of a number of means known to those skilled in the art (least recently used (LRU), random, pseudo-LRU, etc.) to be evicted. If the data in the chosen block is modified, that data is written to the next lowest level in the memory hierarchy which may be another cache (in the case of the L1 or on-board cache) or main memory (in the case of an L2 cache, as depicted in the two-level architecture of FIG. 1). By the principle of inclusion, the lower level of the hierarchy will already have a block available to hold the written modified data. However, if the data in the chosen block is not modified, the block is simply abandoned and not written to the next lowest level in the hierarchy. This process of removing a block from one level of the hierarchy is known as an "eviction". At the end of this process, the cache no longer holds a copy of the evicted block.

FIG. 2 illustrates the foregoing cache structure and eviction process. A cache 40 (L1 or a lower level) includes a cache directory 42, a cache entry array 44, an LRU array 46, and control logic 48 for selecting a block for eviction from a particular congruence class. The depicted cache 40 is 8-way set associative, and so each of the directory 42, cache entry array 44 and LRU array 46 has a specific set of eight blocks for a particular congruence class as indicated at 50. In other words, a specific member of the congruence class in cache directory 42 is associated with a specific member of the congruence class in cache entry array 44 and with a specific member of the congruence class in LRU array 46, as indicated by the "X" shown in congruence class 50.

Each of the blocks in directory 42 are connected to the control logic via an error correction code (ECC) circuit 52. A bit in a given cache block may contain an incorrect value, either due to a soft error (such as stray radiation or electrostatic discharge) or to a hard error (a defective cell). ECCs can be used to reconstruct the proper data stream. Some ECCs can only be used to detect and correct single-bit errors, i.e., if two or more bits in a particular block are invalid, then the ECC might not be able to determine what the proper data stream should actually be, but at least the failure can be detected. Other ECCs are more sophisticated and even allow detection or correction of double errors. These latter errors are costly to correct, but the design tradeoff is to halt the machine when double-bit errors occur. Although only directory 42 is shown with ECC circuits, these circuits can similarly be used with other arrays, such as cache entry array 44.

The outputs of ECC circuits 52, whose values correspond to (corrected) memory block addresses, are connected to respective comparators 54 each of which also receives the address of the requested memory block. If a valid copy of a requested memory block is in the congruence class 50, then one, and only one, of the comparators 54 will output an active signal. The outputs of comparators 54 are connected to a multiplexer 56 and also to an OR gate 58, whose output controls multiplexer 56. If a cache hit occurs (a requested address matches with an address in cache directory 42), then OR gate 58 activates multiplexer 56 to pass on a signal indicating which member of the congruence class matches the address. This signal controls another multiplexer 60 which receives inputs from each of the entries in cache entry array 44. In this manner, when a cache hit in the directory occurs, the corresponding value is passed through multiplexer 60 to a bus 62.

If a cache miss occurs, and if all of the blocks in the particular congruence class 50 already have valid copies of memory blocks, then one of the cache blocks in congruence class 50 must be selected for victimization. This selection is performed using the LRU bits for the congruence class in LRU array 46. For each cache block in the class, there are a plurality of LRU bits, for example, three LRU bits per block for an 8-way set associative cache. The LRU bits from each block in the class are provided as inputs to a decoder 64 having an 8-bit output to indicate which of the blocks is to be victimized. This output is coupled to multiplexer 56. In this manner, if OR gate 58 is not active, multiplexer 56 passes on an indication of the cache block to be used based on the outputs of decoder 64.

The ECC circuits discussed above are one way to deal with soft errors arising in memory cells. Another approach used for dealing with hard errors is to provide redundancy within the arrays (directory, LRU, cache). When a cache chip is fabricated, it can be tested to determine if there are any defective row or column lines in each of the arrays (row and column lines are tested for the entire cache, directory, and LRU. If a line is defective, a fuse can be permanently blown to indicate its defective nature. A comparison is then made inside the array for each accessed address to see if it matches with a defective address. If so, appropriate logic re-routes the address to one of many extra row and column lines formed on the chip, i.e., from redundant bit lines (columns) and word lines (rows). The number of extra bit and word lines may vary depending upon the defect rate and desired chip yield. For a low-defect (larger physical size) cache, two extra lines might be provided for every 256 regular lines, while in a high-defect (smaller physical size) cache, two extra lines might be provided for every eight regular lines.

There are several disadvantages and limitations in the foregoing cache construction. With respect to ECC circuits 52, these circuits are fairly complex and not only take up space on the chip, but further slow down processing since they are in the critical (timing) path for retrieving the cached values (either from directory or cache). The ECC circuits might allow for correction of double bit errors, but not for multiple bit errors with more than two bad bits. Another aspect of these prior art cache constructions that adds complexity and slows down processing is the arbitration logic 66 that is required to selectively interconnect the cache with the CPU, for CPU snoops, or with the system bus, for system bus snoops. This logic is again in the critical path. Such use of a single cache by two snooping devices inherently gives rise to certain other delays, such as when both the CPU and the system bus want to perform a read on the cache at the same time; the two read operations cannot be performed simultaneously, but must be serialized by the arbitration logic. The same is true for write operations.

Another disadvantage in cache construction relates to the use of bit line redundancy and word line redundancy. While this technique can increase chip yield, the redundancies get directly in the critical path for array access. Extra time is required to search against defective row and column lines, and to re-direct requests that match with a defective line. So the tradeoff is a higher yield versus slower cache response. Another disadvantage is the additional physical size that must be provided for the redundant lines. In the example where two extra lines were provided for every 8 regular lines, 25% extra cache size (overhead) is required, and much of this space will never even be used. Redundant lines also do not scale particularly well, e.g., if the cache size was doubled (from say 64 bytes to 128 bytes), the amount of silicon (chip space) required for the redundant lines will likewise double. Finally, the use of redundant lines which are used based on fuses blown in the cache is static and fairly wasteful. The availability of the redundant lines is based on the state of the cache during testing. In high density, large cache chips operating under varying conditions of junction temperature and internal voltages, defects in the cache build but these additional defective lines cannot be re-directed. Not only must numerous extra lines be provided to increase yield, but many of those lines are never even used.

In light of the foregoing, it would be desirable to provide a cache construction having improved handling of defective cache lines, including speeding up cache access and providing exceptional error correction capability. It would be further advantageous if the cache construction provided for efficient and dynamic use of all available cache lines without complicated logic circuits, and scaled appropriately to larger cache lines.

SUMMARY OF THE INVENTION

It is therefore one object of the present invention to provide an improved cache to be used by a processor of a computer system.

It is another object of the present invention to provide such a cache that efficiently uses all available cache lines without excess logic circuits in the critical path.

It is yet another object of the present invention to provide such a cache having improved handling of defects, including defect avoidance and error correction.

It is still another object of the present invention to provide such a cache having faster read access.

The foregoing objects are achieved in a method of accessing values stored in a cache used by a processor of a computer system, generally comprising the steps of loading a plurality of memory blocks from a memory device connected to the processor via a system bus into respective cache lines of the cache, writing address tags associated with the memory blocks into first and second cache directories of the cache, and thereafter reading a first memory block from the cache using the first cache directory, while simultaneously reading a second memory block from the cache using the second cache directory. The first and second cache directories are preferably redundant, and a given one of the address tags is written to a specific line of the first directory and to a specific line of the second directory that corresponds to the specific line of the first directory. The cache can have a single cache entry array, or two (redundant) cache entry arrays connected respectively to the two cache directories; the read operation is accomplished by constructing control signals for the two memory blocks to be read, based on locations of corresponding address tags in the directories, and then applying the control signals to two multiplexers having inputs connected to the single cache entry array, or having inputs that are respectively connected to the first and second entry arrays. The first cache directory can be connected to a first interconnect on a processor side of the cache, and the second cache directory can be connected to a second interconnect on a system bus side of the cache, whereby the memory blocks are read by presenting the first memory block to the first interconnect using the first multiplexer, and presenting the second memory block to the second interconnect using the second multiplexer. If an error occurs when examining a particular address tag in the first cache directory, then a redundant address tag can be substituted for the particular address tag by examining a line of the second cache directory which corresponds with the line in the first cache directory containing the particular address tag.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein:

DESCRIPTION OF THE PREFERRED EMBODIMENT

Figure 3:
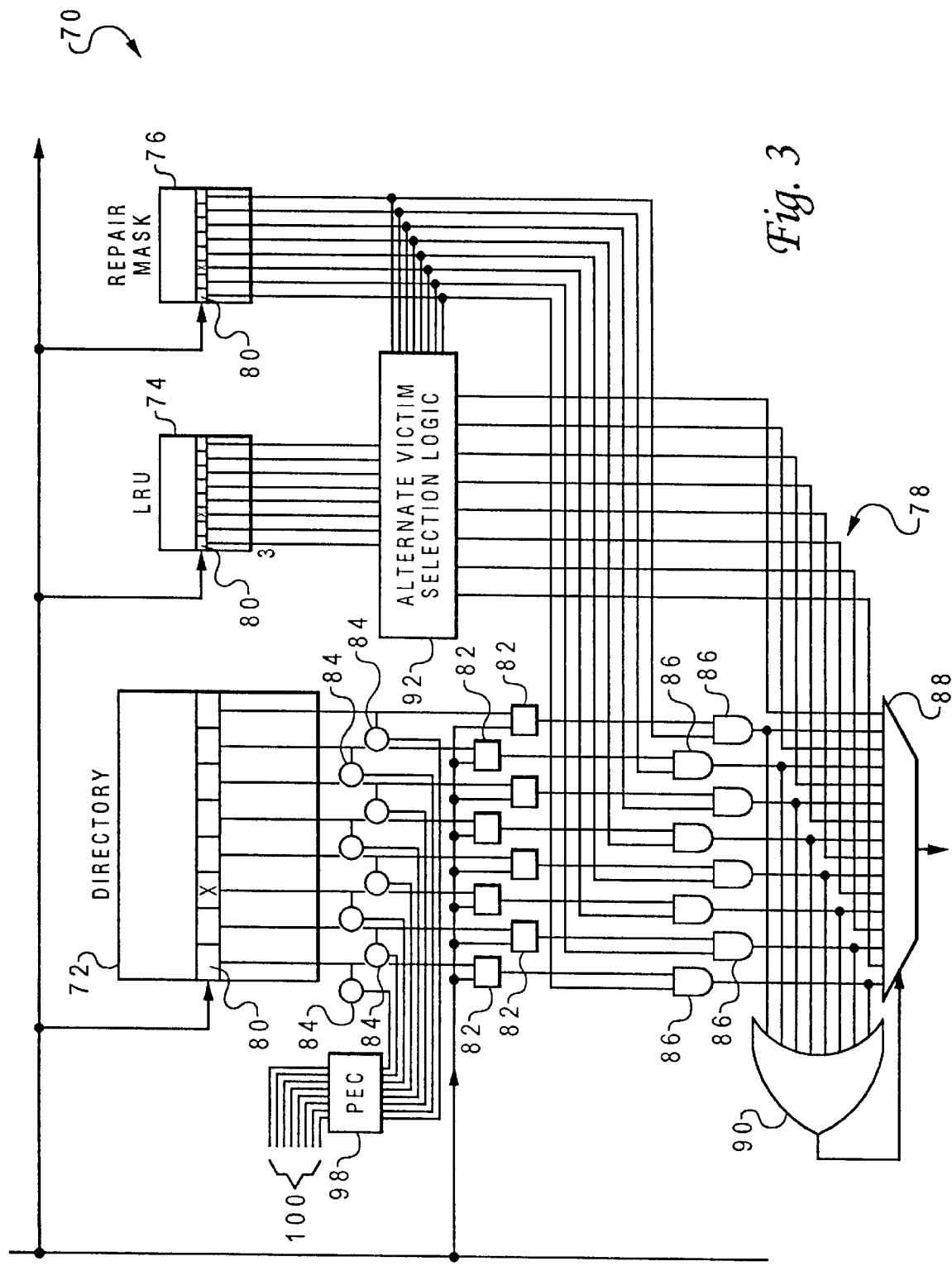
FIG. 3 is a high level schematic diagram of a set associative cache constructed in accordance with the present invention, having parity error control and a dynamic repair mask.

With reference now to the figures, and in particular with reference to FIG. 3, there is depicted a high level schematic diagram of one embodiment of a set associative cache 70 constructed in accordance with the present invention. Cache 70 generally includes a cache directory 72, an LRU array 74, a repair mask 76, and control logic 78. Cache directory 72 has a plurality of address tags associated into sets, with the depicted embodiment being 8-way set associative, so each of the directory 72, LRU array 74 and repair mask 76 has a specific set of eight blocks for a particular congruence class as indicated at 80. A cache entry array (not shown) contains values associated with the address tags in directory 72.

Figure 1:
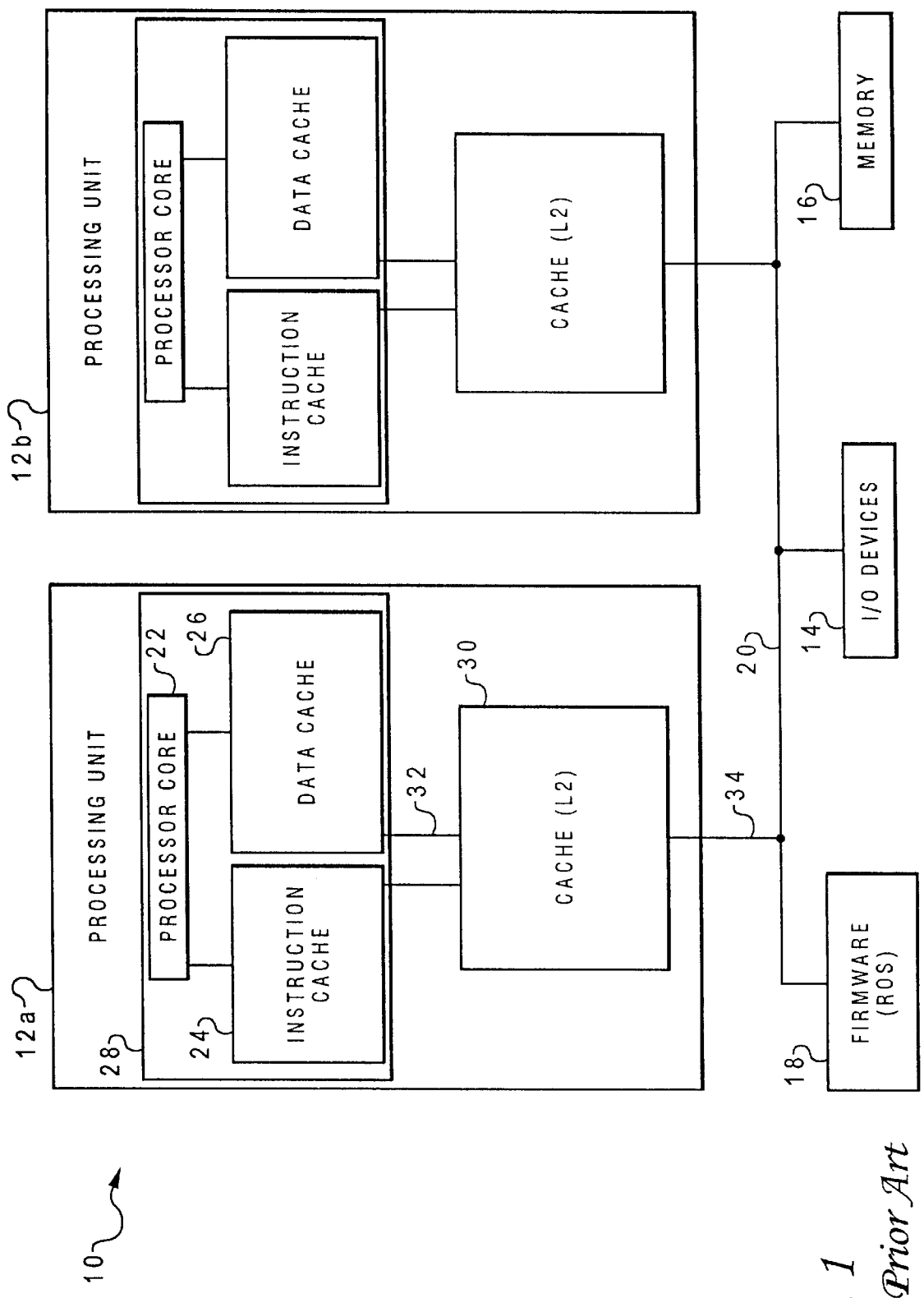
FIG. 1 is a block diagram of a prior art multiprocessor computer system.
Figure 2:
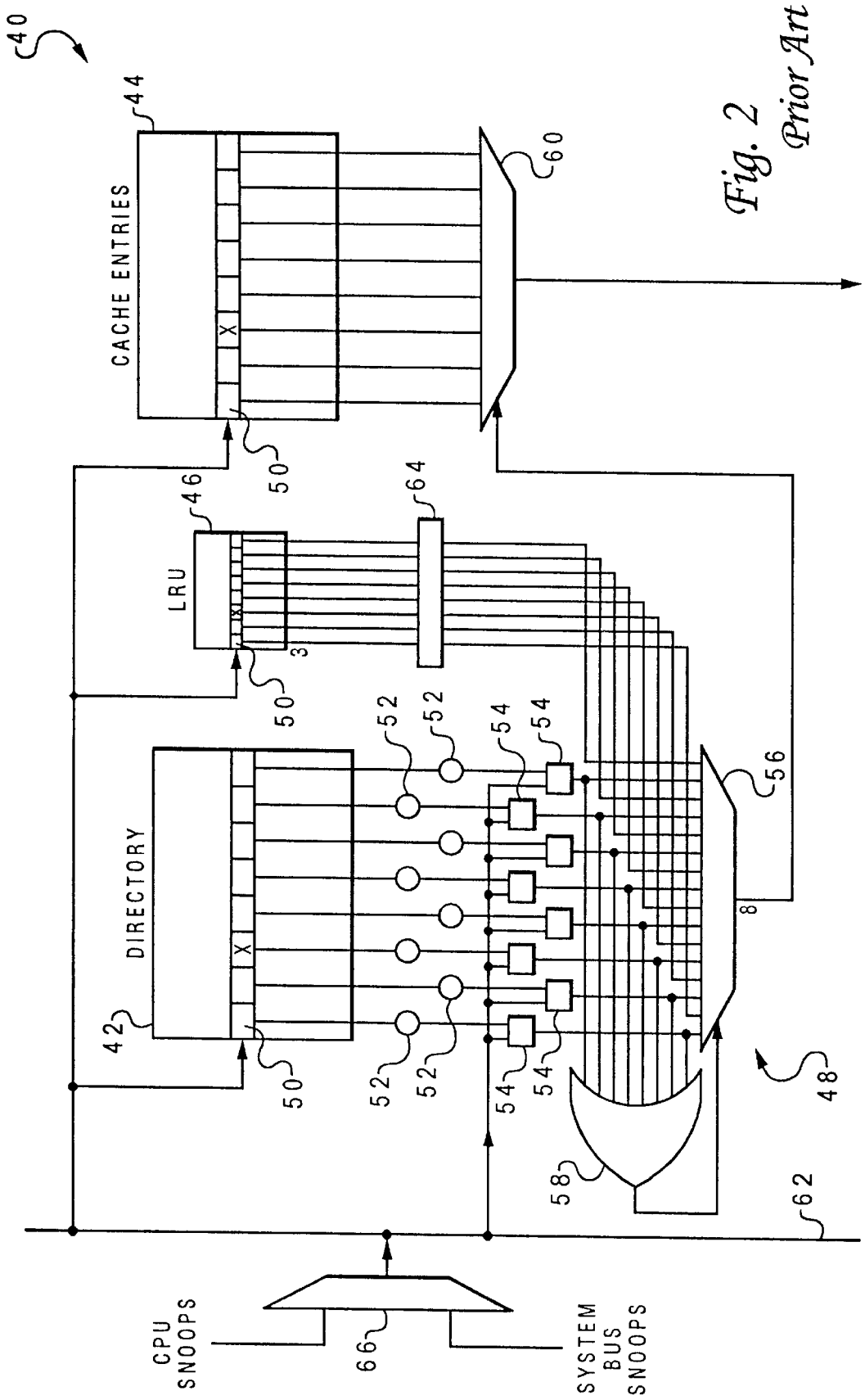
FIG. 2 is a high level schematic diagram of a prior art, set associative cache.

Each block in a given congruence class of directory 72 has an output connected to a respective comparator 82, each of which receives the address of a requested memory block. If a valid copy of the requested memory block is in the congruence class 80, then one and only one of the comparators 82 will output an active signal to indicate which member of the set holds the valid copy. Each of the outputs from directory 72 is also connected to a respective parity checker 84, in parallel with the connection to a respective comparator 82. Parity checkers 84 do not perform any correction of erroneous bits, but rather are used only to indicate that an error has occurred in reading an address tag (or status bit) from directory 72. This error information is used as discussed further below. Importantly, since the parity checkers are connected in parallel with the comparators, they are out of the critical path, i.e., the parity checkers do not affect cache performance (i.e., decrease speed) because they can perform the parity checking concurrently, at the same time that the remaining logic is handling the request (of course, the parity checkers decrease speed if an error is found to have occurred, but this is the exception). Also, the parity checkers, which may use conventional parity checking techniques, are less complicated than error correction code (ECC) circuits such as are used in the prior art (compare FIG. 2) and so take up less space on the cache chip (silicon wafer). The use of offline parity checkers is shown for the cache directory, but can in addition be used by a cache entry array, rather than providing traditional ECC logic.

The outputs of comparators 82 are connected to an array of AND gates 86. Each AND gate 86 receives a single comparator output and one other output from repair mask 76. Repair mask 76 is used to indicate whether a particular block is defective (any portion of the cache line, including that portion in directory 72, the cache entry array, or LRU array 74). In this embodiment, the state of an output of repair mask 76 is active (on or high) if the corresponding cache line is valid; if a cache line is defective, the corresponding output from repair mask 78 will be inactive (off or low). In this manner, the output of any AND gate 86 will be active only if (1) the corresponding comparator 82 indicated a cache hit, and (2) the corresponding entry in repair mask 76 indicates that the line is valid. In other words, if a cache hit would occur except that the corresponding entry in repair mask 76 indicates that the line is defective, then the output of that entry in repair mask 76 will go inactive, making the output of the corresponding AND gate 86 also inactive (forcing a "miscompare"). Thus, a defective cache line will never result in a cache hit.

The outputs of AND gates 86 are fed to a multiplexer 88 and also to an OR gate 90, whose output controls multiplexer 88. If a cache hit occurs in a non-defective cache line, then OR gate 90 activates multiplexer 88 to pass on a signal to the cache entry array indicating which member of the congruence class matches the address. If a cache miss occurs, and if all of the blocks in the particular congruence class 80 already have valid copies of memory blocks, then one of the cache blocks must be selected for victimization. This selection is tentatively performed by LRU array 74, which may contain a conventional least-recently-used algorithm. The outputs of the LRU, which are indicative of which block has been tentatively selected for victimization, are connected to an alternate victim selection logic circuit 92, which also receives inputs from repair mask 76. If the tentatively selected victim is not defective, then alternate victim selection logic circuit 92 simply passes the LRU outputs to multiplexer 88 which in turns passes on the victimization information to the cache entry array. If the tentatively selected victim is defective, then alternate victim selection logic circuit 92 selects a new tentative victim. If the new tentative victim is not defective, then the corresponding information is transmitted to multiplexer 88. If the new tentative victim is also defective, then alternate victim selection logic circuit 92 repeats the process until a non-defective victim is selected. Thus, a defective cache line will never be chosen as a victim. If all of the mask bits for a given congruence class are set to indicate that all members of the class are defective, then the system can respond with a halt or other operation as would arise with a double-bit ECC error.

It can be seen that repair mask 76 is a convenient means for both keeping a defective cache line from ever indicating a cache hit and keeping a defective cache line from ever being chosen as a victim. Repair mask 76 can accordingly be used in place of the bit line redundancy and word line redundancy provided in prior art cache components. While some extra space on the cache chip is required for adding the repair mask, this space is generally negligible compared to the amount of space that is saved by eliminating redundant bit lines and word lines within the directory array, LRU array, and cache array. This advantage increases with increasing cache-line sizes, i.e., the repair mask array size doesn't grow as cache line size is scaled. Also, by using repair mask 76, all available cache lines are used, instead of some (redundant) cache lines never used, making more overall efficient use of the cache. Repair mask 76 further provides these advantages without any re-routing overhead, and without requiring "fuse-blow" for the directory array, LRU array, or cache array. This, in turn, allows significantly faster cache operation and significantly reduced manufacturing cost.

This novel method of using functional masking to bypass defects in caches eliminates the performance degradation and the silicon area increase of the standard cache defect repair method. From a functionality perspective, certain congruence classes may be effectively running 6-way or 7-way set associative (instead of the intended 8-way set associative). However, due to the statistical nature of cache behavior, this reduction in associativity for certain congruence classes is typically unnoticeable at the user level.

The use of a repair mask additionally allows for dynamic cache defect bypassing (of locations in the caches that are generating errors) by updating the repair mask real-time when the errors are detected. The cache lines may be tested initially at fabrication and any noted defects can be handled by permanently setting the value of the corresponding field in the repair mask. Thereafter, each time the computer is booted (turned on), the mask might be automatically updated based on firmware testing, as part of the boot process. Finally, the repair mask can be updated upon detection of directory parity errors, cache entry array ECC errors, or LRU errors. A hardware algorithm could be provided to set the values in the repair mask array. For example, one 2-bit field could be provided in the repair mask for each cache line. The 2-bit field may initially be set to zero, and incremented each time a error is detected on that cache line. This allows the 2-bit field to act as a counter, setting the cache line as defective only when three cumulative parity errors have been recorded for a given cache line.

In order to continue to reliably run the processor after encountering defective cache locations, when the repair mask entry associated with the line in the cache is set to indicate the line is defective, the contents of the cache at that location are flushed. Once the repair mask entry has been set, any future accesses to that cache line will be forced by the repair mask to see a miss on that line, and the line would never be re-used (victimized). This solution has practically no overhead when compared to prior art schemes, such as redundant lines. It is also particularly useful in those applications where the processors operate in harsh environments but must continue to function in the event of run-time defects.

Figure 4:
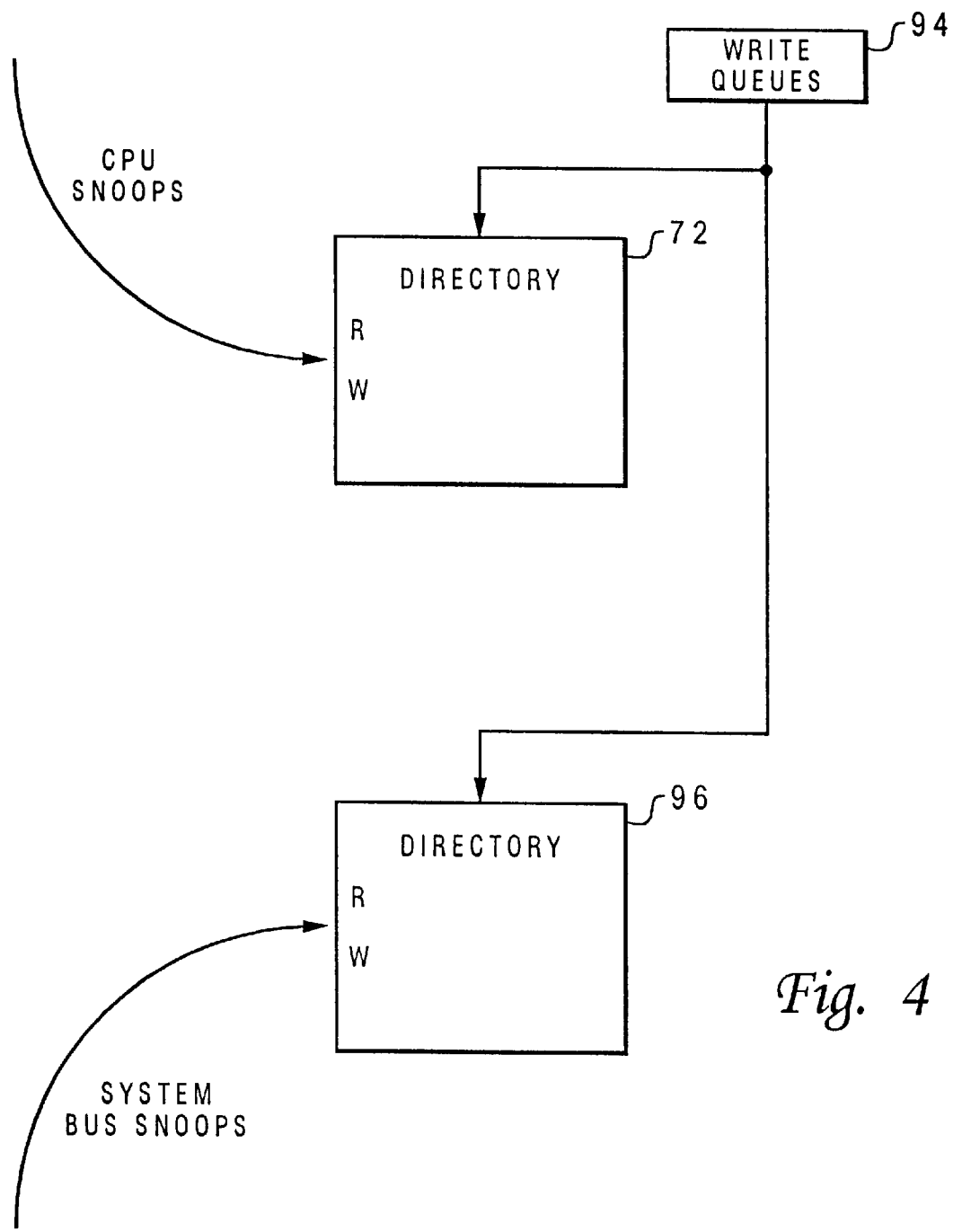
FIG. 4 is a block diagram of a cache constructed in accordance with the present invention, having two redundant directories.

FIG. 3 shows only a single directory 72, but a cache constructed in accordance with the present invention may have an additional directory 96 as shown in FIG. 4. Directories 72 and 96 are redundant, but directory 72 is used for CPU snoops and directory 96 is used for system bus snoops; in other words, one directory is provided for each snooping device/interconnect. This construction provides several advantages. First, if both directories are constructed with the parity checkers described in conjunction with FIG. 3, then each directory may serve as a backup to the other. In other words, when a parity error occurs, for example, on an address tag in directory 72, then the address tag may instead be read from directory 96.

If a parity error occurs, a parity error control (PEC) unit 98 such as that shown in FIG. 3 can be used to handle the error. PEC unit 98 is connected to each of the parity checkers 84, as well as to parity checkers of the other directory 96, as indicated by the connection lines at 100. When PEC unit 98 first detects a parity error from any parity checker, it forces the cache into a busy mode where requests are either retried or not acknowledged, until the error is handled. PEC unit 98 then reads the address tag (and the status bits) from the designated block in the other (non-error producing) directory, and supplies this address tag to the problem directory, i.e., directly to the appropriate comparator 82. After updating the problem array, PEC unit 82 allows the cache to resume normal operations.

One particularly advantageous aspect of the PEC and parity checkers of the present invention is that they may be used to provide a form of multiple-bit error detection and correction. A particular value (address tag) can be broken up into several portions, such as dividing up a 24 bit address tag into three 8-bit bytes. A parity bit is then provided for each portion, i.e., three parity bits per address tag in this example. If one bit in each portion has an erroneous value, then the error is still detected, since each portion will indicate an parity error, and a parity error for only one portion is sufficient to alarm PEC 98. Thereafter, all three errors are corrected by substituting the bit field (address tag) from the other directory, and so the present invention can allow correction of multiple bit errors.

In FIG. 4, the line designated "CPU Snoops" generally refers to operations from an interconnect on the CPU side of the cache, and could include a direct interconnect to the CPU or a direct interconnect to another snooping device, i.e., a higher-level cache (e.g., L1); "System Bus Snoops" generally refers to operations from an interconnect on the system bus side of the cache and could include a direct interconnect to the system bus or a direct interconnect to another snooping device, i.e., lower-level cache (e.g. L2). Accordingly, the invention is not limited to any particular level of the cache hierarchy or the overall depth thereof.

Although FIG. 4 depicts only redundant cache directories, redundant cache entry arrays (two) could similarly be used, with parity checkers instead of mainline ECC circuits, wherein an error in one cache entry array would result in the value being read from the corresponding cache line of the other cache entry array. Although this approach would require practically doubling the size of cache, it speeds up cache operation and, as technology allows cache sizes to grow smaller and smaller, the overall size of the cache may become less significant that its speed. Also, any such increase in cache size may be partially offset by reductions in size arising from use of the above-described repair mask.

Another advantage of the use of two directories in the cache is the ability to perform two read operations per cycle, that is, one read operation from the CPU snoop and one read operation from the system bus snoop in parallel. This feature significantly improves overall read access time from the CPU and system bus since, in prior art cache designs, only one read operation can be performed in any given cycle. In the present invention, both reads can be performed in a single clock cycle. The only potential disadvantage to the use of redundant directories is the required doubling of cache directory size. This size increase may be acceptable, however, given the improved performance associated with the ability to perform two snoop operations in one cycle. Moreover, the cache speed may increase further due to the removal of ECC circuits in the critical path which makes the read operations occur even faster.

Yet another advantage of providing a plurality of cache directories to independently respond to operations from a plurality of snooping devices is the elimination of arbitration logic to select between CPU and system bus snoops. Since arbitration logic is traditionally in the critical path, this improves access times, as well as generally lessening the complexity of the cache. Still another advantage of providing two directories relates to the physical layer—when a single directory is used, it requires longer access times for some cache lines which are physically spaced from the directory on the cache chip. For example, a single directory is often placed near the center of a chip to minimize such lengthened access times. By providing two directories, they may be physically spaced apart on the cache chip (i.e., near the sides instead of the center), allowing quicker response time by shortening conductive paths on the chip.

The dual read ability may also be provided with a single cache entry array or with two (redundant) cache entry arrays. In the latter case, two different multiplexers, separately controlled by two different control circuits respectively connected to the two directories 72 and 96, are used to read data from the two cache entry arrays. In the former case, two different multiplexers may still be used but they can be connected to the same cache entry array, i.e., each cache block has two output lines, one connected to a first multiplexer for the CPU snoop, and another connected to a second multiplexer for the system bus snoop.

When a memory block is written to the cache of FIG. 4, the address tag (and any miscellaneous bits such as the state and inclusivity fields) must be written to both directories 72 and 96. Write can be performed using one or more write queues 94 connected to directories 72 and 96. Writes to the two directories can happen in parallel; however, this requires that neither the CPU port nor the system bus port be executing a read, and so such parallel writes may take longer to drain from the write queues of the cache directories since there may be extended periods wherein, for every cycle, there is read operation being executed by one of the directories. Therefore, writes to the two directories may also be staggered, which is another advantage associated with the provision of multiple (redundant) cache directories.

In the latter implementation, for example, when the CPU is performing a read operation via directory 72, the system bus can be performing a write operation on directory 96 in the same cycle. The corresponding write operation to directory 72 can be put off (placed in a write queue) until the next or a subsequent cycle, when the CPU snoop is not performing any read (or other non-write) operation. Breaking up the write operation in this manner speeds up cache operation when redundant directories are used. If separate (redundant) cache entry arrays are used in conjunction with the two cache directories, then the operations of writing the memory block to the cache entry arrays may similarly be staggered.

This staggered writing also complements the ability to provide for separate reading from a directory. For example, consider the sequence wherein, during a first cycle, a read operation is occurring on directory 72 and a staggered write operation has just begun by first writing to directory 96; then, during a second cycle, the staggered write operation is completed by writing to directory 72, and a totally unrelated read occurs on directory 96. Thus, two read operations and one write operation were performed in two cycles. Although this effect might serendipitously be obtained without staggered writing (e.g., by having two read operations performed in a first cycle, followed by parallel writes to both directories in a second cycle), use of this feature imparts greater flexibility in execution of snoop operations which further improves performance.

Although the invention has been described with reference to specific embodiments, this description is not meant to be construed in a limiting sense. Various modifications of the disclosed embodiment, as well as alternative embodiments of the invention, will become apparent to persons skilled in the art upon reference to the description of the invention. It is therefore contemplated that such modifications can be made without departing from the spirit or scope of the present invention as defined in the appended claims.

We claim:

1. A method of accessing values stored in a cache used by a processor of a computer system, comprising the steps of:

loading a plurality of memory blocks from a memory device connected to the processor via a system bus into respective cache lines of the cache;

writing address tags associated with the memory blocks into first and second cache directories of the cache, wherein the first and second cache directories are redundant, and said writing step writes a given one of the address tags to a specific line of the first directory and to a specific line of the second directory that corresponds to the specific line of the first directory; and reading a first memory block from the cache using the first cache directory, while reading a second memory block from the cache using the second cache directory, wherein the first and second memory blocks are read in a single clock cycle of the processor.

2. The method of claim 1 wherein each of the first and second cache directories have a plurality of congruence classes each having a plurality of lines for storing the address tags, and said step of the processor reading the first memory block while the system bus is reading the second memory block includes the steps of:
  associating a first requested address with a first congruence class in the first cache directory;
  comparing each of the address tags stored in the first congruence class with a portion of the first requested address;
  associating a second requested address with a second congruence class in the second cache directory; and
  comparing each of the address tags stored in the second congruence class with a portion of the second requested address.

3. The method of claim 1 wherein the cache has a single cache entry array, and said step of reading the first memory block while reading the second memory block includes the steps of:
  constructing a first control signal for the first memory block based on a first location in the first directory of an address tag associated with the first memory block;
  applying the first control signal to a first multiplexer having inputs connected to the cache entry array;
  constructing a second control signal for the second memory block based on a second location in the second directory of an address tag associated with the second memory block; and
  applying the second control signal to a second multiplexer having inputs connected to the cache entry array.

4. The method of claim 1 wherein the cache has first and second cache entry arrays, and said step reading the first memory block while reading the second memory block includes the steps of:
  constructing a first control signal for the first memory block based on a first location in the first directory of an address tag associated with the first memory block;
  applying the first control signal to a first multiplexer having inputs connected to the first cache entry array;
  constructing a second control signal for the second memory block based on a second location in the second directory of an address tag associated with the second memory block; and
  applying the second control signal to a second multiplexer having inputs connected to the second cache entry array.

5. The method of claim 2 wherein, if an error occurs when examining a particular address tag as part of said step of comparing the address tags stored in the first congruence class, then a redundant address tag is substituted for the particular address tag by examining a line of the second cache directory which corresponds with the line in the first cache directory containing the particular address tag.

6. The method of claim 3 wherein the first cache directory is connected to a first interconnect on a processor side of the cache, and the second cache directory is connected to a second interconnect on a system bus side of the cache, and said step of reading the first memory block while reading the second memory block further includes the steps of:
  presenting the first memory block to the first interconnect by connecting the first interconnect to an output of the first multiplexer; and
  presenting the second memory block to the second interconnect by connecting the second interconnect to an output of the second multiplexer.

7. The method of claim 4 wherein the first cache directory is connected to a first interconnect on a processor side of the cache, and the second cache directory is connected to a second interconnect on a system bus side of the cache, and said step of reading the first memory block while reading the second memory block further includes the steps of:
  presenting the first memory block to the first interconnect by connecting the first interconnect to an output of the first multiplexer; and
  presenting the second memory block to the second interconnect by connecting the second interconnect to an output of the second multiplexer.

8. A computer system comprising:
  a processor;
  a memory device;
  a system bus connected to said memory device;
  a cache having a plurality of cache lines for storing memory blocks corresponding to addresses of said memory device;
  means for simultaneously reading a first memory block from said cache and reading a second memory block from said cache in a single clock cycle of said processor, wherein said simultaneous reading means including first and second redundant cache directories; and
  means for writing an address tag of a memory block which is stored in said cache to a specific line of said first cache directory and to a specific line of said second directory that corresponds to said specific line of said first cache directory.

9. The computer system of claim 8 wherein said cache has a single cache entry array, and said simultaneous reading means includes means for:
  constructing a first control signal for said first memory block based on a first location in said first directory of an address tag associated with said first memory block;
  applying said first control signal to a first multiplexer having inputs connected to said cache entry array;
  constructing a second control signal for said second memory block based on a second location in said second directory of an address tag associated with said second memory block; and
  applying said second control signal to a second multiplexer having inputs connected to said cache entry array.

10. The computer system of claim 8 wherein said cache has first and second cache entry arrays, and said simultaneous reading means includes means for:
  constructing a first control signal for said first memory block based on a first location in said first directory of an address tag associated with said first memory block;
  applying said first control signal to a first multiplexer having inputs connected to said first cache entry array;
  constructing a second control signal for said second memory block based on a second location in said second directory of an address tag associated with said second memory block; and
  applying said second control signal to a second multiplexer having inputs connected to said second cache entry array.

11. The computer system of claim 8 wherein each of said first and second cache directories have a plurality of congruence classes each having a plurality of lines for storing address tags, and said simultaneous reading means further includes means for:

associating a first requested address with a first congruence class in said first cache directory;

comparing each of said address tags stored in said first congruence class with a portion of said first requested address;

associating a second requested address with a second congruence class in said second cache directory; and comparing each of said address tags stored in said second congruence class with a portion of said second requested address.

12. The computer system of claim 9 further comprising a first interconnect for communicating with said processor, and a second interconnect for communicating with said system bus, and wherein said simultaneous reading means further includes means for:

presenting said first memory block to said first interconnect by connecting said first interconnect to an output of said first multiplexer; and presenting said second memory block to said second interconnect by connecting said second interconnect to an output of said second multiplexer.

13. The computer system of claim 10 further comprising a first interconnect for communicating with said processor, and a second interconnect for communicating with said system bus, and wherein said simultaneous reading means further includes means for:

presenting said first memory block to said first interconnect by connecting said first interconnect to an output of said first multiplexer; and presenting said second memory block to said second interconnect by connecting said second interconnect to an output of said second multiplexer.

14. The computer system of claim 11 wherein, if an error occurs when examining a particular address tag as part of said comparing of said address tags stored in said first congruence class, then a redundant address tag is substituted for said particular address tag by examining a line of said second cache directory which corresponds with a line in said first cache directory containing said particular address tag.

* * * * *